United States Patent
Barfknecht et al.

(10) Patent No.: US 9,680,445 B2
(45) Date of Patent: Jun. 13, 2017

(54) PACKAGED DEVICE INCLUDING CAVITY PACKAGE WITH ELASTIC LAYER WITHIN MOLDING COMPOUND

(71) Applicant: Avago Technologies General IP (Singapore) Pte. Ltd., Singapore (SG)

(72) Inventors: Andrew Thomas Barfknecht, Menlo Park, CA (US); Klaus-Guenter Oppermann, Holzkirchen (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 141 days.

(21) Appl. No.: 14/529,394

(22) Filed: Oct. 31, 2014

(65) Prior Publication Data

US 2016/0126443 A1    May 5, 2016

(51) Int. Cl.
| | | |
|---|---|---|
| *H01L 41/053* | (2006.01) | |
| *H03H 9/05* | (2006.01) | |
| *H03H 9/10* | (2006.01) | |
| *H05K 3/28* | (2006.01) | |

(52) U.S. Cl.
CPC .......... *H03H 9/0523* (2013.01); *H03H 9/059* (2013.01); *H03H 9/1014* (2013.01); *H03H 9/1071* (2013.01); *H05K 3/284* (2013.01); *H05K 2201/10083* (2013.01)

(58) Field of Classification Search
CPC .............................. H05K 3/284; H01L 41/053
USPC ........................... 310/340, 344, 348; 174/521
See application file for complete search history.

(56) References Cited

U.S. PATENT DOCUMENTS

| | | | |
|---|---|---|---|
| 6,429,511 B2 | 8/2002 | Ruby et al. | |
| 6,946,320 B2 | 9/2005 | Sunwoo et al. | |
| 7,345,410 B2 | 3/2008 | Grannen et al. | |
| 7,358,831 B2 | 4/2008 | Larson, III et al. | |
| 7,382,081 B2 * | 6/2008 | Takano ..................... | H03H 3/08 310/340 |
| 8,064,221 B2 * | 11/2011 | Kuroda ................ | H05K 3/3442 174/255 |
| 8,120,230 B2 * | 2/2012 | Takai ................. | H03H 9/02937 310/313 R |
| 2003/0009864 A1 * | 1/2003 | Kim .................... | H03H 9/02913 29/25.35 |
| 2005/0253282 A1 | 11/2005 | Lu et al. | |

(Continued)

FOREIGN PATENT DOCUMENTS

JP    5565544 B2 *    8/2014    ............... H03H 9/25

OTHER PUBLICATIONS

Warren W. Flack et al., "An Investigation of the Properties of Photosensitive Polyimide Films", Ultratech Stepper, Inc. 1996, pp. 1-17.

(Continued)

*Primary Examiner* — Thomas Dougherty

(57) ABSTRACT

A device includes a substrate; a cavity package having a first surface attached to the substrate, the cavity package enclosing an electronic circuit; an elastic layer formed on a second surface of the cavity package, opposite the first surface; and a molding compound formed on the substrate, encasing the cavity package and the elastic layer. The elastic layer decouples stress between the cavity package and the molding compound encasing the cavity package, for maintaining structural integrity of the cavity package and for preventing separation of the cavity package from the substrate.

17 Claims, 5 Drawing Sheets

(56) References Cited

U.S. PATENT DOCUMENTS

| | | | |
|---|---|---|---|
| 2007/0069367 A1* | 3/2007 | Bunyer | H01L 23/562 257/701 |
| 2007/0089525 A1* | 4/2007 | Momose | B60C 23/0408 73/753 |
| 2007/0164637 A1* | 7/2007 | Onozawa | H03H 9/1085 310/344 |
| 2009/0302713 A1* | 12/2009 | Bayer | H01L 41/0533 310/340 |
| 2010/0045145 A1* | 2/2010 | Tsuda | H03H 3/08 310/365 |
| 2010/0272310 A1 | 10/2010 | Philliber et al. | |
| 2011/0084573 A1* | 4/2011 | Yamaji | H03H 9/1092 310/340 |
| 2011/0156836 A1* | 6/2011 | Lee | H03H 9/0566 333/133 |
| 2012/0075026 A1 | 3/2012 | Ruby et al. | |
| 2013/0119493 A1 | 5/2013 | Chou et al. | |
| 2014/0118089 A1 | 5/2014 | Bradley et al. | |
| 2014/0118090 A1 | 5/2014 | Grannen et al. | |
| 2015/0243875 A1* | 8/2015 | Hira | H03H 9/1085 310/313 B |
| 2016/0060450 A1* | 3/2016 | Toyoda | H03H 9/1085 156/60 |

OTHER PUBLICATIONS

Kazuhiro Yoshida, "Murata Combines Precision, Reliability in MEMS Sensor", AEI, Dec. 2012, pp. 28-30.

\* cited by examiner

PACKAGED DEVICE INCLUDING CAVITY PACKAGE WITH ELASTIC LAYER WITHIN MOLDING COMPOUND

BACKGROUND

Small acoustic components, including acoustic resonators and transducers, are employed in a number of devices, including acoustic filters used for radio frequency (RF) wireless communications, for example. Various types of acoustic resonators include surface acoustic wave (SAW) resonator devices and bulk acoustic wave (BAW) resonator devices, including thin film bulk acoustic resonator (FBAR) devices and solidly mounted resonator (SMR) devices. For example, FBARs operating at frequencies close to their fundamental resonance frequencies may be used as key components of RF filters and duplexers in mobile devices.

Some conventional RF filter devices are packaged in hermetically sealed, chip-scale "microcap" dies, which may be referred to as cavity packages. A cavity package includes an electronic circuit (e.g., acoustic resonators and corresponding circuitry forming an RF filter) arranged in a cavity formed between a base substrate and a lid separated by a seal-ring. The cavity package may be flip-chipped onto a printed circuit board (PCB) or other substrate or substrate laminate, and then overmolded with an epoxy molding compound. The molding compound protects the cavity package and provides a surface for subsequent handling of the packaged parts. However, various environmental factors, such as temperature changes, hygroscopic swelling, and/or external mechanical shocks, cause the molding compound to exert forces on the cavity package that tend to pull the cavity package apart at its seal-ring. For example, the different materials used for the cavity package and the molding compound typically have different coefficients of thermal expansion (CTE), resulting in different rates of expansion and contraction in response to temperature changes, which exerts forces (stresses) on the cavity package. In other words, the presence of the molding compound may actually work to breach the RF filter device's hermetically sealed cavity package, or even break solder joints joining the cavity package to the PCB.

It is therefore desirable to develop packaged devices, including one or more hermetically sealed micro-cap dies or cavity packages, in which forces exerted on the cavity packages by the molding compound under stress is reduced.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
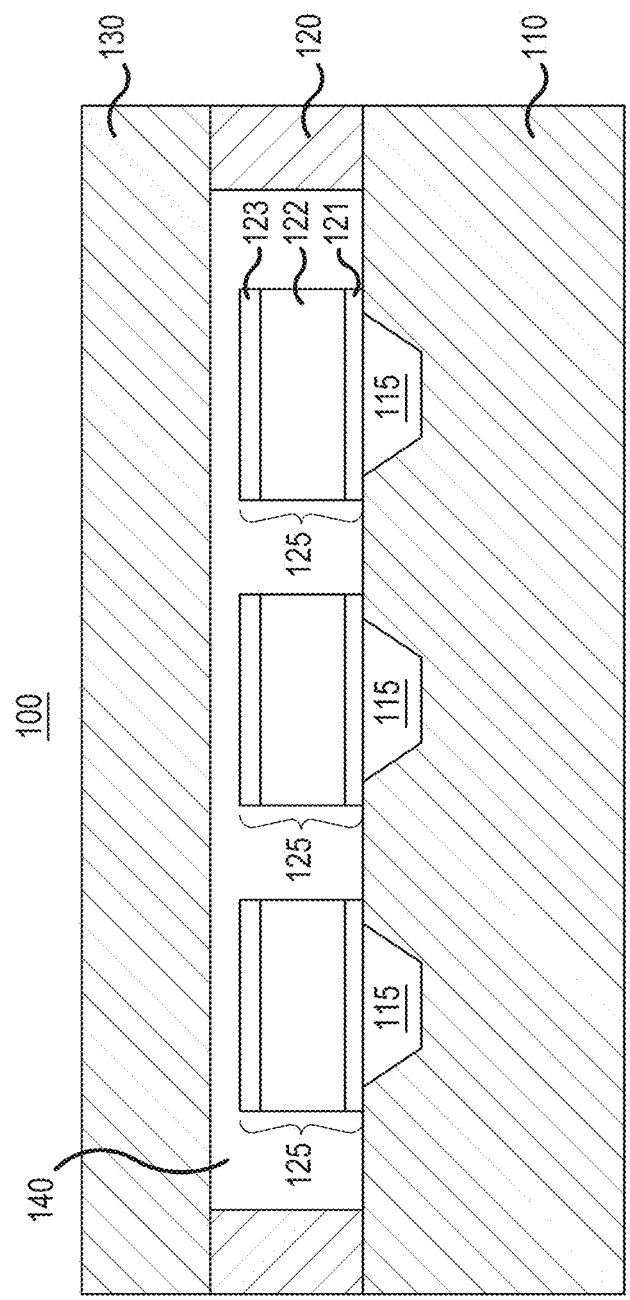
FIG. 1 is a cross-sectional view of a cavity package containing illustrative FBARs.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, in various representative embodiments, a compliant material is applied as an elastic layer between a chip-scale microcap die (or "cavity package") and a molding compound encasing the cavity package in an overmolded chip-on-board module. The cavity package includes an internal cavity formed by a base substrate, a lid and a seal-ring formed between the base substrate and the lid for bonding the base substrate and the lid, hermitically sealing the internal cavity. The cavity package may also include at least one via passing through the lid and/or the base substrate to provide an electrical signal path and/or a thermal conduction path between the inside and outside of the cavity package. The via includes a corresponding via seal that maintains the hermetic seal of the internal cavity where the via penetrates the lid and/or the base substrate, and otherwise supports the bonding integrity of the seal-ring.

The elastic layer is applied to the top surface of the cavity package, which is the surface opposite to that attached to a package substrate, such as a PCB, and therefore is incorporated more simply. For instance, the compliant material may be deposited by syringe directly on top of the cavity package after reflow of solder joints attaching the cavity package to the PCB, and before over molding. The elastic layer applied to the die reduces the amount of stress that is transferred to the cavity package from that molding compound and/or the amount of forces applied to the cavity package by the molding compound, as well as to the solder joints.

FIG. 1 is a simplified cross-sectional view of a cavity package containing illustrative FBARs.

Referring to FIG. 1, a hermetically sealed cavity package (or microcap die) 100 includes a base substrate 110, a lid 130 and a peripheral seal-ring 120 formed between the base substrate 110 and the lid 130, forming an enclosed cavity 140. Although the seal-ring 120 is depicted as a separate element having a single layer, it is understood that the seal-ring 120 may be integrally formed with one of the lid 130 or the base substrate 110 and/or may include multiple layers of the same or different materials. For example, the seal-ring 120 may be formed, entirely or in part, on the surface of one of base substrate 110 or the lid 130, and then bonded to a layer of metal on the other one of the base substrate 110 or the lid 130. The seal-ring 120 bonds the base substrate 110 and the lid 130, resulting in a hermetic seal. The base substrate 110 and the lid 130 may be formed of semiconductor materials, such as silicon (Si), gallium arsenide (GaAs), indium phosphide (InP), glass, sapphire, alumina, or the like, for example, and may be formed of the same or different materials. The seal-ring 120 may be formed of a metal material, such as gold (Au), copper (Cu), or may be solder or a diffusion bond, for example. Examples of microcap dies and formation thereof are described by U.S. Patent App. Pub. No. 2010/0272310 (Oct. 28, 2010), to Philliber et al., which is hereby incorporated by reference in its entirety.

In various embodiments, an electronic circuit is arranged and hermetically sealed within the cavity 140 formed, at least in part, by the internal separation between the base substrate 110 and the lid 130 resulting from placement of the seal-ring 120. The electronic circuit may be an acoustic filter, for example, that includes multiple FBARs and corresponding circuitry, indicated by representative FBARs 125, for purposes of illustration. Each of the FBARs 125 generally comprises a bottom electrode 121 positioned over a corresponding air cavity 115 formed in the base substrate 110, a piezoelectric layer 122 disposed on the bottom electrode 121, and a top electrode disposed on the piezoelectric layer 122. Various illustrative fabrication techniques for an air cavity in a substrate are described by U.S. Pat. No. 7,345,410 (Mar. 18, 2008), to Grannen et al., which is hereby incorporated by reference in its entirety. One or both of the base substrate 110 and the lid 130 may include through-holes to provide conductive vias (not shown) for establishing electrical and/or thermal connections outside the cavity package 100. Each of the vias may terminate in a seal structure similar to the peripheral seal-ring 120. That is, just like that seal-ring 120, the via seals may be integrally formed with one of the lid 130 or the base substrate 110 and/or may include multiple layers of the same or different materials. For example, the via seal may be formed, entirely or in part, on the surface of one of base substrate 110 or the lid 130, and then bonded to a layer of metal on the other one of the base substrate 110 or the lid 130. Examples of conductive vias and via seals, according to various embodiments, are discussed below with reference to FIGS. 2, 3 and 4B.

The bottom electrode 121 may be formed of one or more electrically conductive materials, such as various metals compatible with semiconductor processes, including tungsten (W), molybdenum (Mo), iridium (Ir), aluminum (Al), copper (Cu), platinum (Pt), ruthenium (Ru), niobium (Nb), or hafnium (Hf), for example. In various configurations, the bottom electrode 121 may be formed of two or more layers of electrically conductive materials, which may by the same as or different from one another. Likewise, the top electrode 123 may be formed of electrically conductive materials, such as various metals compatible with semiconductor processes, including tungsten (W), molybdenum (Mo), iridium (Ir), aluminum (Al), copper (Cu), platinum (Pt), ruthenium (Ru), niobium (Nb), or hafnium (Hf), for example. In various configurations, the top electrode 123 may be formed of two or more layers of electrically conductive materials, which may by the same as or different from one another. Also, the configuration and/or the material(s) forming the top electrode 123 may be the same as or different from the configuration and/or the material(s) forming the bottom electrode 121.

The piezoelectric layer 122 may be formed of any piezoelectric material compatible with semiconductor processes, such as aluminum nitride (AlN), zinc oxide (ZnO), or zirconate titanate (PZT), for example. Also, in various embodiments, piezoelectric layer 122 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 122, thereby off-setting at least a portion of degradation of electromechanical coupling coefficient $Kt^2$ of the acoustic resonator. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (published as U.S. Patent App. Pub. No. 2014/0118089 on May 1, 2014), and U.S. patent application Ser. No. 13/662,460 (filed Oct. 27, 2012), to Grannen et al. (published as U.S. Patent App. Pub. No. 2014/0118090 on May 1, 2014), which are hereby incorporated by reference in their entireties. Of course, doping piezoelectric layers with one or more rare earth elements may be applied to any of various embodiments, including the embodiments described below with reference to the other figures.

Of course electronic circuits other than acoustic filter circuits may be included within the cavity 140, without departing from the scope of the present teachings. Likewise other types of acoustic filters, such acoustic filters including SMRs or SAWs, without departing from the scope of the present teachings.

When SMRs are incorporated, the corresponding air cavities 115 are replaced by acoustic reflectors, such as distributed Bragg reflectors (DBR) or acoustic mirrors, for example. Each of the acoustic resonators may have a corresponding dedicated acoustic reflector formed in the base substrate 110, or a single acoustic reflector may extend the length of the base substrate 110 providing acoustic reflection for all of the acoustic resonators. The acoustic reflector(s) includes multiple stacked pairs of acoustic reflector layer pairs, where each pair includes a low acoustic impedance layer formed of low acoustic impedance material stacked on a high acoustic impedance layer formed of high acoustic impedance material. Examples of low acoustic impedance materials include as boron silicate glass (BSG), silicon oxide ($SiO_x$) or silicon nitride ($SiN_x$) (where x is a positive real number), carbon-doped silicon oxide (CDO), chemical vapor deposition silicon carbide (CVD SiC), plasma enhanced CVD SiC (PECVD SiC), niobium molybdenum (NbMo), titanium (Ti) or aluminum. Examples of high acoustic impedance materials include tungsten (W), molybdenum (Mo), iridium (Ir), hafnium oxide ($HfO_2$), aluminum oxide ($Al_2O_3$), diamond or diamond-like carbon (DLC). Various illustrative fabrication techniques of acoustic mirrors are described by U.S. Pat. No. 7,358,831 (Apr. 15, 2008), to Larson III, et al., which is hereby incorporated by reference in its entirety.

Figure 2:
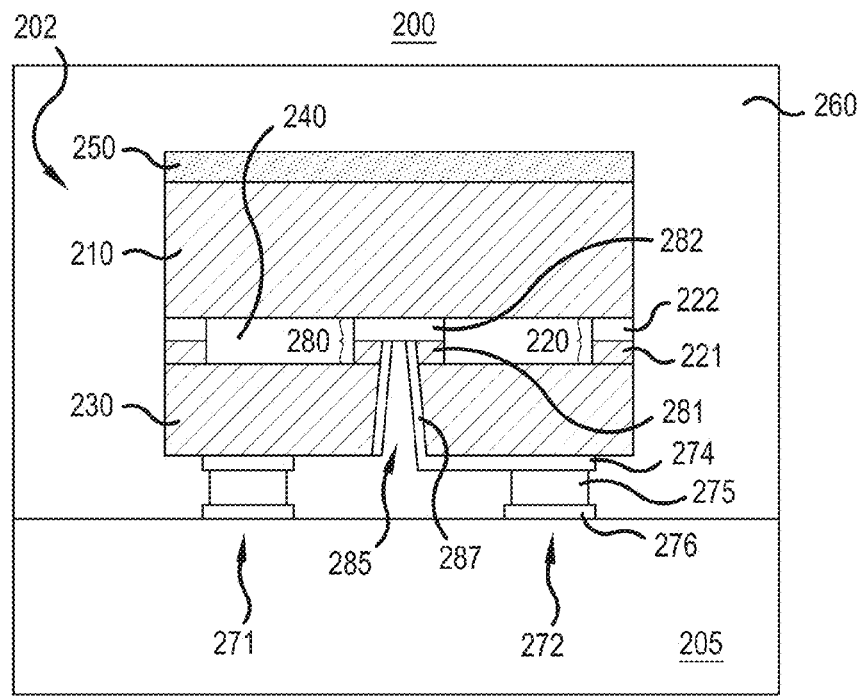
FIG. 2 is a cross-sectional view of a packaged device including a cavity package with an elastic layer for stress reduction, according to a representative embodiment.

FIG. 2 is a simplified cross-sectional view of a packaged device including a hermetically sealed cavity package with an elastic layer for stress reduction, according to a representative embodiment.

Referring to FIG. 2, a packaged device 200 includes a cavity package 202 flip-chip mounted to a substrate 205, for example. The cavity package 202 is therefore inverted in the depicted configuration, with a peripheral seal-ring 220 formed between a lid 230 and a base substrate 210, which may be substantially the same as the peripheral seal-ring 120, the lid 130 and the base substrate 110 discussed above with reference to FIG. 1. The separation space formed by the seal-ring 220 provides a hermetically sealed, enclosed cavity 240 containing a sealed electronic circuit (not shown in FIG. 2). Examples of packaged devices and formation thereof are described by U.S. Patent App. Pub. No. 2012/0075026 (Mar. 29, 2012), to Ruby et al., which is hereby incorporated by reference in its entirety.

In the depicted embodiment, the cavity package 202 further includes a via 285 formed (in a corresponding through-hole) through the lid 230. The via 285 has a conductive inner surface (or plating) 287 configured to provide an electrical signal path between the inside (cavity 240) of the cavity package 202 and the outside of the cavity package 202. The via 285 may also serve as a thermal conduction path. A via seal 280, corresponding to the via 285, is formed within the cavity 240 to hermetically seal the entrance of the via 285. Thus, when the via 285 and the via seal 280 are present, the hermetic seal of the cavity 240 is maintained by the peripheral seal-ring 220 and the via seal 280. The via seal 280 may also help the seal-ring 220 by providing mechanical support for the cavity package 202, e.g., to keep the lid 230 and the base substrate 210 from being forced towards each other in the center area of the cavity 240 and/or to keep the lid 230 and the base substrate 210 from being pulled away from each other.

The cavity package 202 is electrically and mechanically connected to the substrate 205 by multiple solder joints, indicated by representative solder joints 271 and 272, formed between the lid 230 and the substrate 205. Referring to the solder joint 272 for purposes of illustration, each solder joint may include a solder bump 275 formed between conductive (e.g., copper) contact pads 274 and 276 formed on opposing surfaces of the lid 230 and the substrate 205, respectively. In various configurations, the contact pad 274 may be electrically connected to the conductive inner surface 287 of the via 285 (or other via) for establishing electrical and thermal connections to the sealed electronic circuit inside the cavity package 202. In other words, the solder joints 271 and 272 mechanically attach the cavity package 202 to the substrate 205, provide electrical signal paths between metal lines (not shown) on the cavity package 202 and traces (not shown) on the substrate 205 that lead to vias (e.g., via 285), and provide low-thermal resistance paths to allow heat to flow from the cavity package 202 to the substrate 205.

As mentioned above, each of the seal-ring 220 and the via seal 280 may be formed as a single layer on one of the lid 230 or the base substrate 210. Alternatively, each of the seal-ring 220 and the via seal 280 may be formed by multiple layers, and/or formed integrally with one of the lid 230 and the base substrate 210. In the example depicted in FIG. 2, the seal-ring 220 is formed by a bottom portion 221 that may be a raised portion of the material of the lid 230 or a separate layer of material added to the lid 230. Similarly, the via seal 280 is formed by a bottom portion 281 that may be another raised portion of the material of the lid 230 or a separate layer of material added to the lid 230. The bottom portions 221, 281 may be formed of a dielectric material, such as silicon (Si), gallium arsenide (GaAs), indium phosphide (InP), glass, sapphire, alumina, silicon oxide (SiO) or silicon nitride (SiN), for example. The top portions 222, 282 may be formed of a conductive bonding material, such as gold (Au), copper (Cu) or solder, for example.

The substrate 205 may be a PCB, for example, and/or a laminate substrate comprising multiple layers of one or more materials. The one or more layers of the substrate 205 may be formed of semiconductor materials, such as silicon (Si), gallium arsenide (GaAs), indium phosphide (InP), glass, sapphire, alumina, or the like, for example. Alternatively, the PCB or substrate 205 may be formed of a fiberglass-epoxy laminate (such as FR-4), Teflon®, ceramics, special polymers, or low dielectric plastic, for example.

An elastic layer 250 is disposed on a top surface of the cavity package 202, which is actually the bottom surface of the base substrate 210 in the flip-chip configuration. Stated differently, the elastic layer 250 is disposed on a surface of the cavity package 202 that is opposite a surface of the cavity package 202 attached to the substrate 205. In various embodiments, another elastic layer (not shown) may be formed between the cavity package 202 and the substrate 205 in the area of the solder joints 271, 272. A molding compound 260 is formed over the substrate 205, encasing the cavity package 202, the elastic layer 250 and the solder joints 271, 272. The packaged device 200 thus represents an overmolded chip-on-board module incorporating the elastic stress-decoupling elastic layer 250 on the cavity package 202.

The elastic layer 250 is formed of a compliant or elastomeric material that provides bending, compressive and tensile flexibility, such as a polyimide or a silicone elastomer, for example, although other types of compliant materials may be incorporated. Examples of silicone elastomers include RTV615, available from GE Bayer Silicones, and Sylgard® 184 Silicone, available from Dow Corning Corporation, although other compliant materials with suitably low elastic moduli may be used, without departing from the scope of the present teachings. The elastic layer 250 may have a thickness in a range of about 1 μm to about 16 μm, although the thickness may vary to provide unique benefits for any particular situation or to meet application specific design requirements of various implementations, as would be apparent to one skilled in the art.

The molding compound 260 is formed of a protective material compatible with semiconductor processes, such as an epoxy resin, although other types of protective materials may be incorporated. The molding compound 260 is relatively rigid, particularly in comparison with the elastic layer 250. In various embodiments, the compliant material of the elastic layer 250 is chosen to provide a corresponding Young's modulus that is lower than the Young's modulus of at least the molding compound 260, the base substrate 210, the seal-ring 220, the lid 230 and the via seal 280.

Notably, compliant material may be separately applied between the cavity package 202 and solder joints 271, 272 to reduce stress that may be applied to the solder joints 271, 272, e.g., by applying the compliant material around the solder joints 271, 272 on the surface of the cavity package 202 facing the substrate 205 (that is, between the lid 230 and the substrate 205). However, incorporating the compliant material on the cavity package 202 around the solder joints may be extraneous since the molding compound 260 provides support around the solder joints and the elastic layer 250 reduces stress on the solder joints that may be induced by the molding compound.

The compliant material of the elastic layer 250 may be applied to the cavity package 202 (or multiple cavity packages 202 arranged in a single packaged device or on a single wafer), by various means during different stages of the fabrication process. For example, the compliant material of the elastic layer 250 may be applied to the back of a wafer comprising multiple cavity packages 202 before dicing, e.g., such that the elastic layers 250 are already on the bottoms of the base substrates 210 when the wafer is segmented to form the cavity packages 202. Alternatively, the elastic layer 250 may be applied to the top of the flipped cavity package 202 after separation from the wafer, but before assembly on the substrate 205, for example. Alternatively, the compliant material of the elastic layer 250 may be applied to the top of the cavity package 202 after the cavity package 202 is attached (e.g., soldered) to the substrate 205, but before over-molding with the molding compound 260. For example, the compliant material may be applied to the top of the cavity package 202 using a syringe. In various embodiments, the compliant material may be applied as a dry film, cast from solution, or dispensed as a liquid, for example.

Generally, the elastic layer 250 decouples stress between the cavity package 202 and the molding compound 260 encasing the cavity package 202, and otherwise reduces potentially destructive forces applied to the cavity package 202. For example, the elastic layer 250 protects the seal-ring 220, in particular, when materials forming/attaching the seal-ring 220 are relatively weak as compared to the stiffer, stronger materials forming the base substrate 110 and the lid 130. Similarly, the elastic layer 250 protects the via seal 280 surrounding the base of the via 285. Decoupling the stress helps to maintain the structural integrity of the cavity package 202, for example, by reducing forces on the cavity package 202 that tend to separate the seal-ring 220 and/or the via seal 280 from the base substrate 210 and/or the lid 230, or that tend to breach the seal-ring 120 and/or the via seal 280 themselves, thereby compromising the combined hermetic seal of the cavity 240. In other words, the elastic layer 250 helps to maintain the hermetic seal. Decoupling the stress also helps to prevent separation of the cavity package 202 from the substrate 205 and/or the solder joints 271 and 272.

In alternative embodiments, the cavity package 202 may be mounted upright on the substrate 205, as opposed to flip chip mounted (and thus not inverted). In this case, the base substrate 210 is mounted to the substrate 205 by the solder joints 271 and 272, and the elastic layer 250 is disposed on the lid 230. However, the function of the elastic layer 250 (e.g., decoupling stress and preserving the integrity of the hermetically sealed cavity 240) would remain the same.

Figure 3:
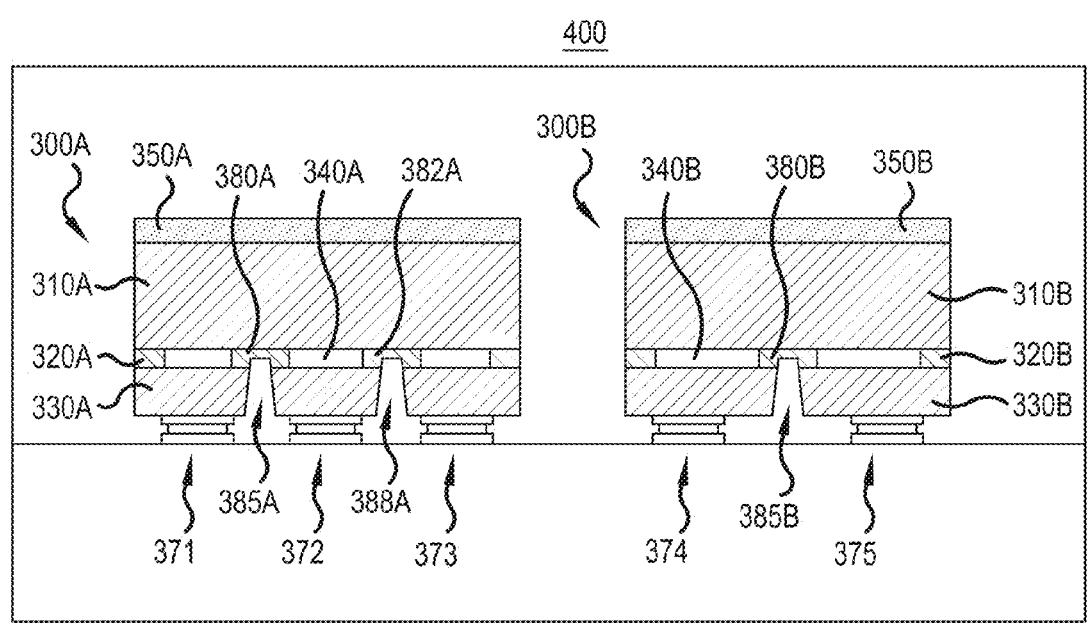
FIG. 3 is a cross-sectional view of a packaged duplexer device including cavity packages with elastic layers for stress reduction, according to a representative embodiment.

FIG. 3 is a cross-sectional view of a packaged duplexer device including multiple cavity packages with elastic layers for stress reduction, according to a representative embodiment. The cross-sectional view is taken along line A-A' of FIG. 4A, discussed below.

Referring to FIG. 3, a packaged device 400 includes multiples cavity packages, indicated by representative cavity packages 300A and 300B, each of which would be similar in construction to representative cavity packages 100 and/or 202, for example, discussed above. The cavity packages 300A and 300B are flip chip mounted to a substrate 305, and are therefore inverted in the depicted configuration. Peripheral seal-rings 320A, 320B are formed between lids 330A, 330B and base substrates 310A, 310B, respectively, as discussed above with reference to the seal-ring 220 in FIG. 2. Likewise, via seals 380A, 382A are formed at the bases of vias 385A and 388A, respectively, between the lid 330A and the base substrate 310A, and via seal 380B is formed at the base of via 385B between the lid 330B and the base substrate 310B, as discussed above with reference to the via seal 280 in FIG. 2. Although the seal-rings 320A, 320B and the via seals 380A, 382A, 380B are depicted as separate, single layer elements, it is understood that the seal-ring 320A and/or the via seals 380A, 382A may be integrally formed with one of the lid 330A or the base substrate 310A and/or of multiple layers of different materials, and/or the seal-ring 320B and the via seal 380B may be integrally formed with one of the lid 330B or the base substrate 310B and/or of multiple layers of different materials, as discussed above, without departing from the scope of the present teachings. For example, the seal-rings 320A, 320B may be formed, entirely or in part, on surfaces of the base substrates 310A, 310B or the lids 330A, 330B, and then bonded to layers of metal on surfaces of the opposing base substrates 310A, 310B or lids 330A, 330B, respectively. Separation space formed by the seal-rings 320A, 320B between the lids 330A, 330B and the base substrates 310A, 310B, respectively, provide the enclosed cavities 340A, 340B containing hermetically sealed electronic circuits. Similarly, the via seals 380A, 382A, 380B seal the bases of the vias 385A, 388A, 385B.

In the depicted example, the packaged device 400 may be a duplexer, where the electronic circuit of the cavity package 300A is a transmit (Tx) filter, such as a ladder filter comprising multiple acoustic resonators (e.g., FBARs) to provide a first (transmit) passband for carrying RF signals from a transmitter (not shown) to a common antenna (not shown), and the electronic circuit in the cavity package 300B is a receive (Rx) filter, such as a ladder filter comprising additional acoustic resonators (e.g., FBARs) to provide a second (receive) passband, different from the first passband, for carrying RF signals from the common antenna to a receiver (not shown). Of course, other application specific configurations of the packaged device 400 do not depart from scope of the present teachings.

The cavity package 300A is electrically and mechanically connected to the substrate 305 by multiple representative solder joints 371, 372 and 373, between the lid 330A and the substrate 305. Likewise, the cavity package 300B is electrically and mechanically connected to the substrate 305 by representative solder joints 374 and 375, between the lid 330B and the substrate 305. As discussed above with reference to the substrate 205, the substrate 305 in FIG. 3 may be a PCB, for example, and/or may be a laminate substrate comprising multiple layers of one or more materials, example of which are mentioned above.

Elastic layers 350A and 350B are disposed on top surfaces of the cavity packages 300A and 300B, respectively. That is, the elastic layer 350A is disposed on a surface of the cavity package 300A that is opposite a surface of the cavity package 300A attached to the substrate 305, and the elastic layer 350B is disposed on a surface of the cavity package 300B that is opposite a surface of the cavity package 300B attached to the substrate 305. In various embodiments, compliant material (not shown) also may be applied between the cavity packages 300A, 300B and the substrate 205 in the area of the solder joints 371-373 and 374-375, respectively. A molding compound 360 is formed over the substrate 305, encasing the cavity packages 300A, 300B, the elastic layers 350A, 350B and the solder joints 371-373 and 374-375. Notably, the packaged device 400 may include more or fewer than two cavity packages or microcap dies (e.g., cavity packages 300A and 300B), without departing from the scope of the present teachings.

As discussed above with reference to the elastic layer 250, each of the elastic layers 350A, 350B are formed of a compliant material (e.g., elastomer) that provides bending, compressive and tensile and flexibility. Also, each of the elastic layers 350A, 350B may have a thickness in a range of about 1 µm to about 16 µm, although the thickness may vary to provide unique benefits for any particular situation or to meet application specific design requirements of various implementations, as would be apparent to one skilled in the art. The elastic layers 350A, 350B thereby decouple stress between the cavity packages 300A, 300B and the molding compound 360 encasing the cavity packages 300A, 300B, respectively.

Figure 4A:
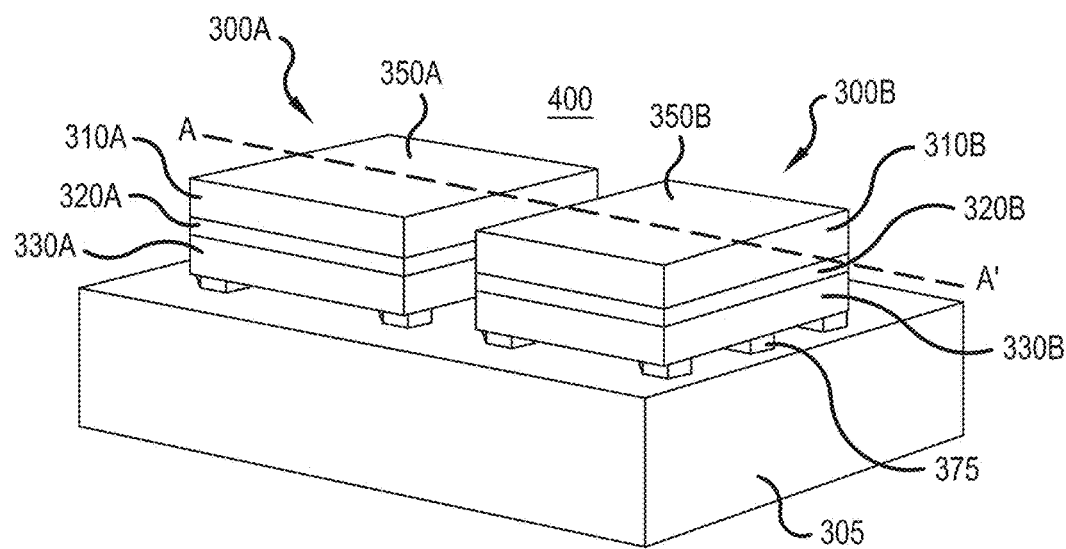
FIG. 4A is a top perspective view of the duplexer device of FIG. 3, partially packaged, including cavity packages with elastic layers, according to a representative embodiment.
Figure 4B:
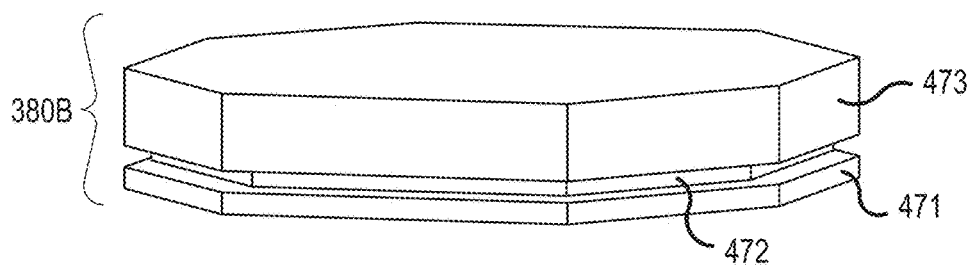
FIG. 4B is a top perspective view of a via seal in the cavity packages with elastic layers, according to a representative embodiment.
Figure 4C:
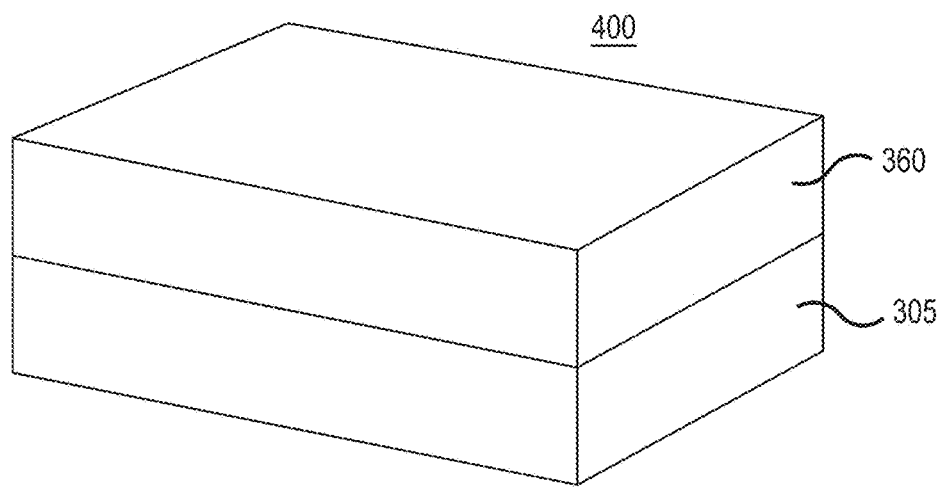
FIG. 4C is a top perspective view of the fully packaged duplexer device of FIG. 2, including cavity packages with elastic layers, according to a representative embodiment.

FIG. 4A is a top perspective view of a portion of the packaged duplexer device of FIG. 3, including cavity packages with elastic layers, according to a representative embodiment. As mentioned above, the cross-section shown in FIG. 3 is taken along line A-A' of FIG. 4A. FIG. 4B is a top perspective view of an illustrative via seal within a packaged duplexer device, and FIG. 4C is a top perspective view of the fully packaged duplexer device of FIG. 3, according to a representative embodiment.

Referring to FIG. 4A, the packaged device 400 is shown prior to application of the molding compound 360. The cavity packages 300A and 300B are flip chip mounted to the substrate 305 via solder joints, including representative solder joints 371-373 and 374-375, respectively (where only solder joint 375 is visible in FIG. 4A). As discussed above, the cavity package 300A includes the seal-ring 320A formed between the lid 330A and the base substrate 310A, and the elastic layer 350A is formed on the top surface of the cavity package 300A. Likewise, the cavity package 300B includes the seal-ring 320B formed between the lid 330B and the base substrate 310B, and the elastic layer 350B is formed on the top surface of the cavity package 300B.

Referring to FIG. 4B, the via seal 380B is shown for purposes of illustration, although the discussion applies to other seals in the packaged device 400 including the via seals 380A and 382A. As shown in FIG. 4B, the via seal 380B includes a pedestal 473, which provides separation between the lid 330B and the base wafer 310B, and two metal layers 471 and 472, one on each side of the joint. In forming the packaged device 400, the metal layers 471 and 472 are joined to one another, e.g., by a "cold weld" diffusion bond or by soldering, to provide electrical and mechanical connections between the lid 330B and the base substrate 310B of the die, and to hermetically seal the cavity 340B (at the base of the via 385B) formed between the lid 330B and the base substrate 310B. The metal layers 471 and 472 may be formed of gold (Au) or copper (Cu), for example, although other materials, or stacks of multiple layers of other materials, including solders, may be used, without departing from the scope of the present teachings. The pedestal 473 may comprise built-up metal or dielectric material, or may simply be a raised portion of the material forming the lid 330B (or alternatively the base substrate 310B) itself. As shown in the example of FIG. 4B, the metal layers 471 and 472 of via seal 380B has a hexagonal shape, although other shapes may be incorporated without departing for the scope of the present teachings.

As mentioned above, the other via seals 380A and 382A of the cavity package 300A may be formed in substantially the same manner. Likewise, the seal-rings 320A and 320B, when comprises of multiple layers, may be formed in substantially the same manner. However, rather than hexagonal shapes, the seal-rings 320A and 320B would be formed in an elongated fashion along each edge (i.e., around the periphery) of the lids 330A and 330B and/or the base substrates 310A and 310B, respectively.

Referring to FIG. 4C, the molding compound 360 is shown as having been disposed over the substrate 305 to form the completed packaged device 400. The molding compound 360 accordingly encases the cavity packages 300A, 300B, the solder joints 371-373 and 374-375, and the elastic layers 350A, 350B. The combined substrate 305 and molding compound 360 provide a protective structure of uniform shape that generally promotes reliability, durability and ease of handling the packaged device 400.

Figure 5:
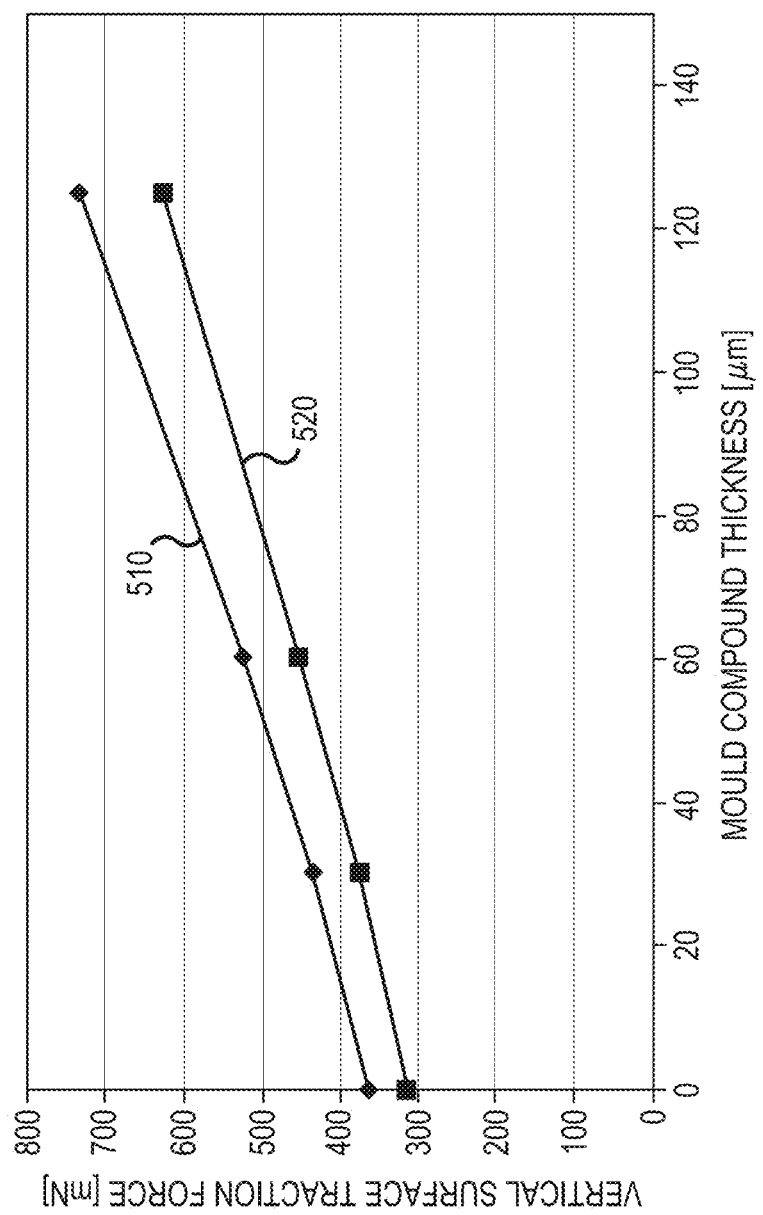
FIG. 5 is a graph showing vertical surface traction force on via seals of a cavity package in a molding compound as a function of molding compound thickness.

FIG. 5 is a graph showing vertical surface traction force on a via seal of a molded cavity package as a function of molding compound thickness. The data for FIG. 5 is provided from a packaged device having two cavity packages (with no corresponding elastic layers), mounted on a substrate and contained within a molding compound.

Referring to FIG. 5, the x-axis depicts the thickness in micrometers (µm) of the molding compound above the package substrate (e.g., PCB), and the y-axis depicts vertical surface traction force in milliNewtons (mN) applied to representative via seals of cavity packages resulting from contact between the cavity packages and the molding compound in which the cavity packages are encased. Trace 510 shows the vertical surface traction force applied to a via seal of a cavity package containing a transmit (Tx) filter (e.g., cavity package 300A with no elastic layer 350A). Trace 520 shows the vertical surface traction force applied to a via seal of a cavity package containing a receive (Rx) filter (e.g., cavity package 300B with no elastic layer 350B). As shown by both traces 510 and 520, the respective vertical surface traction forces increase proportionally (and nearly linearly) with increases in the thickness of the molding compound over the substrate. In other words, the thicker the molding compound, the greater the stress on the cavity package, increasing the likelihood of the via seal (and/or the seal-ring) separating from the base substrate and/or the lid, or otherwise failing. The greater stress also increases the likelihood of the cavity packages breaking one or more of its solder joints (e.g., to the package substrate).

Figure 6:
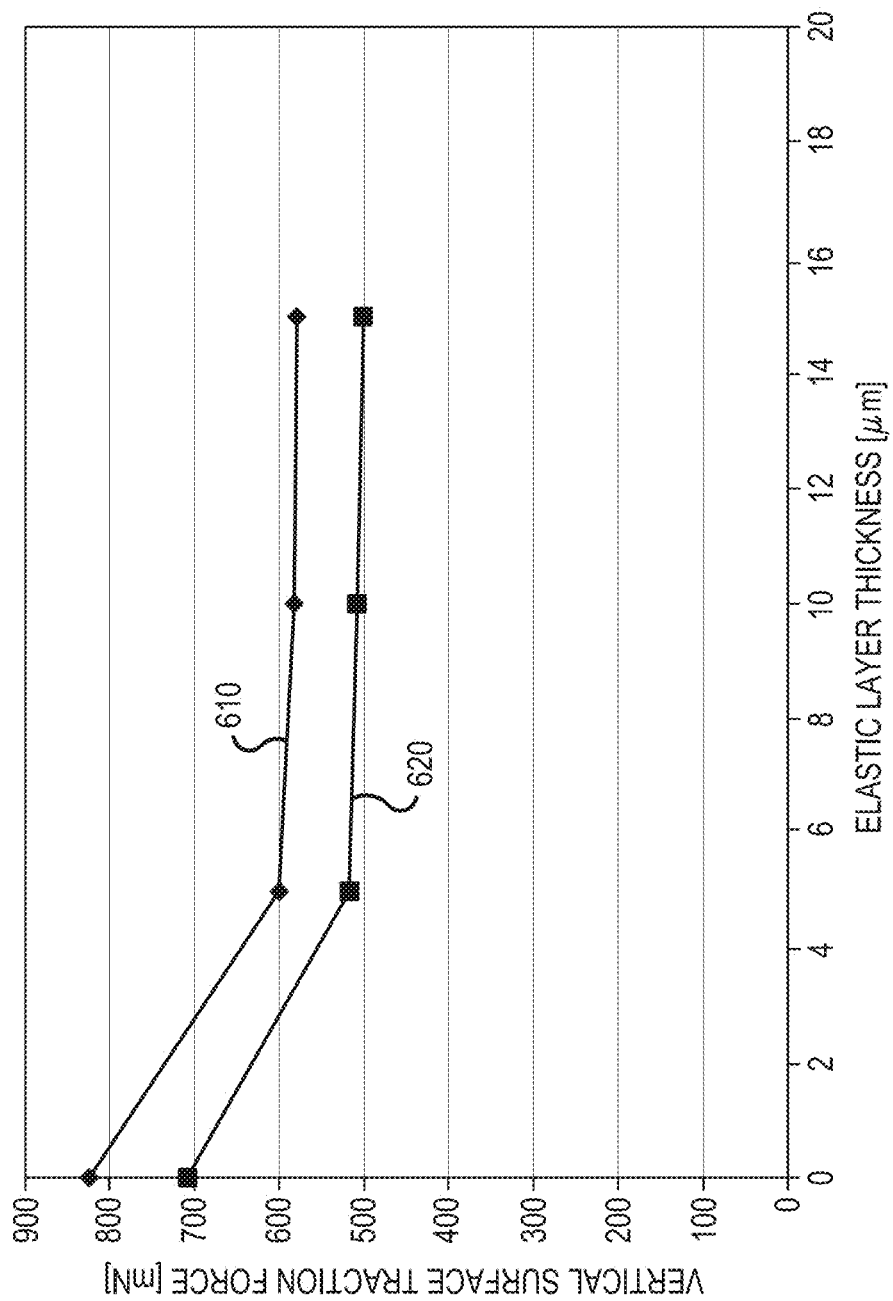
FIG. 6 is a graph showing vertical surface traction force on via seals of a cavity package in a molding compound as a function of elastic layer thickness, according to a representative embodiment.

FIG. 6 is a graph showing vertical surface traction force on an illustrative via seals of molded cavity packages as a function of elastic layer thickness, according to a representative embodiment. The data for FIG. 6 is provided from a packaged device having two cavity packages with corresponding elastic layers, mounted on a package substrate and contained within a molding compound, similar to the illustrative packaged device 400 discussed above with reference to FIGS. 3 and 4A-4C.

Referring to FIG. 6, the x-axis depicts the thickness (in μm) of the elastic layers 350A and 350B on top of the cavity packages 300A and 300B, and the y-axis depicts vertical surface traction force (in mN) applied to representative via seals of the cavity packages 300A, 300B resulting from contact between the cavity packages 300A, 300B and the molding compound 360 in which the cavity packages 300A, 300B are encased. Trace 610 shows the vertical surface traction force applied to a via seal of the cavity package 300A containing a transmit (Tx) filter, and trace 620 shows the vertical surface traction force applied to a via seal of the cavity package 300B containing a receive (Rx) filter. As shown by both traces 610 and 620, the respective vertical surface traction forces decrease proportionally with increases in the thickness of the elastic layers 350A, 350B, respectively. In other words, the thicker the elastic layers 350A, 350B applied to the top of the cavity packages 300A, 300B, respectively, the lower the stress on the via seals of cavity packages 300A, 300B, thereby decreasing the likelihood of the via seals failing, or the seal-rings 320A, 320B separating from the base substrates 310A, 310B and/or the lids 330A, 33B, or otherwise failing, and also decreasing the likelihood of the cavity package 300A, 300B breaking from its solder connections (e.g., to the package substrate 305).

The decrease in vertical surface traction force is especially pronounced between 0 (i.e., no elastic layers) and elastic layers 350A, 350B with thickness of about 5 μm. That is, in the depicted example, the vertical surface traction force applied by the molding compound 360 to the via seal of cavity package 300A decreases from about 820 mN with no elastic layer to about 600 mN with an elastic layer 350A about 5 μm thick. Similarly, in the depicted example, the vertical surface traction force applied by the molding compound 360 to the via seal of cavity package 300B decreases from about 710 mN with no elastic layer to about 520 mN with an elastic layer 350B about 5 μm thick.

According to various embodiments, introduction of a layer of elastic material on top of a cavity package, between the cavity package and the molding compound, reduces forces exerted on the cavity package by the molding compound under stress, in order to help prevent the cavity package from being pulled part at its seal-ring and/or at its via seals, and/or from being pulled loose from the PCB or breaking at the solder joints. Thus, the various embodiments generally improve hermeticity and reliability of package products having hermetically sealed cavity packages, and any other devices that are packaged in cavity packages that are subsequently overmolded. It may also improve reliability of the solder joints on any device that is packaged by being flip-chipped on a substrate and then overmolded.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:
1. A device, comprising:
a substrate;
a cavity package having a first surface attached to the substrate, the cavity package enclosing an electronic circuit, the cavity package being hermetically sealed;
an elastic layer formed on a second surface of the cavity package, opposite the first surface; and
a molding compound formed on the substrate, encasing the cavity package and the elastic layer,
wherein the elastic layer decouples stress between the cavity package and the molding compound encasing the cavity package, at least for maintaining structural integrity of the cavity package, and
wherein a Young's modulus of the elastic layer is lower than a Young's modulus of the molding compound.
2. The device of claim 1, wherein the elastic layer comprises one of a polyimide material or a silicone elastomer material.
3. The device of claim 1, wherein the substrate comprises a laminate printed circuit board (PCB), and the first surface of the cavity package is attached to the laminate PCB via a plurality of solder joints.
4. The device of claim 1, wherein the cavity package comprises a base substrate, a lid and a seal-ring between the base substrate and the lid for bonding the base substrate and the lid.
5. The device of claim 4, wherein the electronic circuit is positioned in a cavity formed, at least in part, by an internal separation between the base substrate and the lid resulting from the seal-ring, and the seal-ring hermetically seals the electronic circuit positioned in the cavity.
6. The device of claim 5, wherein the cavity package further comprises a via formed through one of the lid and the base substrate, and a via seal surrounding a base of the via inside the cavity, the via seal further hermetically sealing the electronic circuit positioned in the cavity, and
wherein the via enables at least electrical connections between the electronic circuit and traces on the substrate.
7. The device of claim 6, wherein the electronic circuit comprises a plurality of resonators.
8. The device of claim 7, wherein the plurality of resonators comprise thin film bulk acoustic resonators (FBARs), solidly mounted resonators (SMRs), or surface acoustic wave (SAW) resonators.
9. The device of claim 3, further comprising:
another elastic layer formed between the cavity package and the substrate in an area of the plurality of solder joints.
10. A microcap die, comprising:
a base substrate;
a plurality of acoustic resonators attached to an inner surface of the base substrate;
a lid disposed over the base substrate;
a seal-ring disposed between the inner surface of the base substrate and an inner surface of the lid, and surrounding the plurality of acoustic resonators, the seal-ring forming a cavity between the inner surface of the lid and the inner surface of the base substrate containing the plurality of acoustic resonators, wherein the seal-ring provides a hermetic seal for the cavity;
an elastic layer formed on one of an outer surface of the lid or an outer surface of the base substrate; and
a molding compound formed over the base substrate, the seal-ring, the lid and the elastic layer,
wherein the elastic layer reduces stress between the molding compound and at least the seal-ring for maintaining the hermetic seal, and wherein a Young's modulus of the elastic layer is lower than a Young's modulus of the molding compound.

11. The microcap die of claim 10, further comprising:
a conductive via formed through one of the base substrate and the lid to enable an electrical connection between the plurality of acoustic resonators outside the cavity; and
a via seal surrounding a base of the conductive via inside the cavity, the via seal providing a further hermetic seal for the cavity.

12. The microcap die of claim 10, wherein the one of the outer surface of the lid or the outer surface of the base substrate is electrically and mechanically attached to a printed circuit board (PCB) via a plurality of solder joints.

13. The microcap die of claim 10, wherein vertical surface traction force applied by the molding compound to the microcap die is inversely proportional to a thickness of the elastic layer.

14. The microcap die of claim 10, wherein the elastic layer is formed of a compliant material applied as a dry film.

15. The microcap die of claim 10, wherein the elastic layer is formed of a compliant material cast from a solution.

16. The microcap die of claim 10, wherein the elastic layer is formed of a compliant material applied by dispensing as a liquid.

17. A device, comprising:
a substrate;
a hermetically sealed cavity package having a first surface attached to the substrate, the cavity package enclosing an electronic circuit;
an elastic layer formed on a second surface of the cavity package, opposite the first surface; and
a molding compound formed on the substrate, encasing the cavity package and the elastic layer,
wherein the elastic layer decouples stress between the cavity package and the molding compound encasing the cavity package, at least for maintaining structural integrity of the cavity package, and
wherein the cavity package comprises:
a base substrate;
a lid;
a seal-ring between the base substrate and the lid for bonding the base substrate and the lid, wherein the electronic circuit is positioned in a cavity formed, at least in part, by an internal separation between the base substrate and the lid resulting from the seal-ring;
a via formed through one of the lid and the base substrate;
a via seal surrounding a base of the via inside the cavity, the via seal further hermetically sealing the electronic circuit positioned in the cavity,
wherein the via enables at least electrical connections between the electronic circuit and traces on the substrate, and wherein the via seal comprises a pedestal, which provides separation between the lid and the base wafer, and two metal layers on the pedestal, the two metal layers being joined to each other to provide the at least electrical connections.

* * * * *